(12) United States Patent
Yudasaka

(10) Patent No.: US 6,373,453 B1
(45) Date of Patent: *Apr. 16, 2002

(54) ACTIVE MATRIX DISPLAY

(75) Inventor: Ichio Yudasaka, Chimo (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/284,774

(22) PCT Filed: Aug. 18, 1998

(86) PCT No.: PCT/JP98/03663

§ 371 Date: Apr. 20, 1999

§ 102(e) Date: Apr. 20, 1999

(87) PCT Pub. No.: WO99/10861

PCT Pub. Date: Mar. 4, 1999

(30) Foreign Application Priority Data

Aug. 21, 1997 (JP) .............................................. 9-225433

(51) Int. Cl.[7] .......................... G09G 3/30; G09G 3/32; G09G 3/10
(52) U.S. Cl. .......................... 345/76; 345/82; 315/169.3
(58) Field of Search .............................. 345/55, 76, 80, 345/82, 84, 92, 206; 349/42, 138, 139, 156; 313/505, 506; 315/169.1, 169.3

(56) References Cited

U.S. PATENT DOCUMENTS 5,500,750 A * 3/1996 Kanbe et al. .................. 349/42
5,986,723 A * 11/1999 Nakamura et al. ............. 349/39
6,002,463 A * 12/1999 Fujikawa ..................... 349/110
6,038,004 A * 3/2000 Nanno et al. .................. 349/44
6,194,837 B1 * 2/2001 Ozawa ..................... 315/169.1

FOREIGN PATENT DOCUMENTS

| JP | A-52-64891 | 5/1977 |
| JP | A-2-66867 | 3/1990 |
| JP | A-9-161970 | 6/1997 |

* cited by examiner

Primary Examiner—Bipin Shalwala
Assistant Examiner—Jeff Piziali
(74) Attorney, Agent, or Firm—Oliff & Berridge, PLC

(57) ABSTRACT

An active matrix display device is provided in which parasitic capacitance or the like is suppressed by forming a thick insulating film around an organic semiconductor film, and disconnection or the like does not occur in an opposing electrode formed on the upper layer of the thick insulating film. In the active matrix display device, first, a bank layer composed of a resist film is formed along data lines and scanning lines. By depositing an opposing electrode of a thin film luminescent element on the upper layer side of the bank layer, capacitance that parasitizes the data lines can be suppressed. Additionally, a discontinuities portion is formed in the bank layer. Since the discontinuities portion is a planar section which does not have a step due to the existence of the bank layer, disconnection of the opposing electrode does not occur at this section. When an organic semiconductor film is formed by an ink jet process, a liquid material discharged from an ink jet head is blocked by the bank layer.

12 Claims, 16 Drawing Sheets

ACTIVE MATRIX DISPLAY

BACKGROUND OF THE INVENTION

1. Field of the Invention

The present invention relates to an active matrix display device in which a thin film luminescent element such as an EL (electroluminescence) element or LED (light emitting diode) element, that emits light by application of a driving current to an organic semiconductor film, is driven and controlled by a thin film transistor (hereinafter referred to as a TFT).

2. Description of the Related Art

Active matrix display devices using current-controlled luminescent elements such as EL elements or LED elements have been disclosed. Since luminescent elements used in display devices of this type are self-luminescent, backlights are not required, unlike in liquid crystal display devices, and the viewing angle dependence is small, all of which are advantageous.

FIG. 13 is a block diagram of an active matrix display device which uses organic thin-film EL elements of the charge-injection type as described above. In an active matrix display device 1A shown in the drawing, on a transparent substrate 10, a plurality of scanning lines gate, a plurality of data lines sig extending in the direction orthogonal to the direction of extension of the scanning lines gate, a plurality of common feeders corn which run parallel to the data lines sig, and a plurality of pixels 7 which are formed in a matrix by the data lines sig and the scanning lines gate are arrayed. A data side drive circuit 3 and a scanning side drive circuit 4 are formed for data lines sig and scanning lines gate, respectively. Each of the pixels 7 includes a conduction control circuit 50 to which scanning signals are supplied through the scanning line gate and a thin film luminescent element 40 which emits light in response to picture signals supplied from the data line sig through the conduction control circuit 50. In this example, the conduction control circuit 50 includes a first TFT 20 in which scanning signals are supplied to a gate electrode through the scanning line gate, a storage capacitor cap for retaining picture signals supplied from the data line sig through the first TFT 20, and a second TFT 30 in which picture signals retained by the storage capacitor cap are supplied to a gate electrode. The second TFT 30 and the thin film luminescent element 40 are connected in series between an opposing electrode op (which will be described later in detail) and the common feeder com. The thin film luminescent element 40 emits light in response to a driving current applied from the common feeder com when the second TFT 30 is ON, and the emission is retained by the storage capacitor cap for a predetermined period of time.

With respect to the active matrix display device 1A having the configuration described above, as shown in FIG. 14 and FIGS. 15(A) and 15(B), in any pixel 7, the first TFT 20 and the second TFT 30 are formed using an island-like semiconductor film. The first TFT 20 has a gate electrode 21 as a portion of the scanning line gate. In the first TFT 20, the data line sig is electrically connected to one of the source and drain regions through a contact hole of a first interlayer insulating film 51, and a drain electrode 22 is electrically connected to the other of the source and drain regions. The drain electrode 22 extends toward the region in which the second TFT 30 is formed, and a gate electrode 31 of the second TFT 30 is electrically connected to this extension through a contact hole of the first interlayer insulating film 51. In the second TFT 30, an interconnecting electrode 35 is electrically connected to one of the source and drain regions through a contact hole of the first interlayer insulating film 51, and a pixel electrode 41 of the thin film luminescent element 40 is electrically connected to the interconnecting electrode 35 through a contact hole of a second interlayer insulating film 52.

As is clear from the FIG. 14 and FIGS. 15(B) and 15(C), the pixel electrode 41 is formed independently in each pixel 7. On the upper layer side of the pixel electrode 41, an organic semiconductor film 43 and the opposing electrode op are deposited in that order. Although the organic semiconductor film 43 is formed in each pixel 7, it may be formed in a strip so as to extend over a plurality of pixels 7. As is seen from FIG. 13, the opposing electrode op is formed not only on a display area 11 in which pixels 7 are arrayed, but also over substantially the entire surface of the transparent substrate 10.

Again, in FIG. 14 and FIG. 15(A), the common feeder com is electrically connected to the other one of the source and drain regions of the second TFT 30 through a contact hole of the first interlayer insulating film 51. An extension 39 of the common feeder com opposes an extension 36 of the gate electrode 31 of the second TFT 30 with the first interlayer insulating film 51 as a dielectric film therebetween to form the storage capacitor cap.

However, in the active matrix display device 1A, since only the second interlayer insulating film 52 is interposed between the opposing electrode op facing the pixel electrode 41 and the data line sig on the same transparent substrate 10, which is different from a liquid crystal active matrix display device, a large amount of capacitance parasitizes the data line sig and the load on the data side drive circuit 3 increases.

SUMMARY OF THE INVENTION

Therefore, as shown in FIG. 13, FIG. 14, and FIGS. 16(A), 16(B), and 16(C), the present inventor suggests that by providing a thick insulating film (bank layer bank, a shaded region in which lines that slant to the left are drawn at a large pitch) between the opposing electrode op and the data line sig and the like, the capacitance that parasitizes the data line sig is decreased. At the same time, the present inventor suggests that by surrounding a region in which the organic semiconductor film 43 is formed by the insulating film (bank layer bank), when the organic semiconductor film 43 is formed of a liquid material (discharged liquid) discharged from an ink jet head, the discharged liquid is blocked by the bank layer bank and the discharged liquid is prevented from spreading to the sides. However, if such a configuration is adopted, a large step bb is formed due to the existence of the thick bank layer bank, the opposing electrode op formed on the upper layer of the bank layer bank is easily disconnected at the step bb. If such disconnection of the opposing electrode op occurs at the step bb, the opposing electrode op in this portion is insulated from the surrounding opposing electrode op, resulting in a dot defect or line defect in display. If disconnection of the opposing electrode op occurs along the periphery of the bank layer bank that covers the surface of the data side drive circuit 3 and the scanning side drive circuit 4, the opposing electrode op in the display area 11 is completely insulated from a terminal 12, resulting in disenabled display.

Accordingly, it is an object of the present invention to provide an active matrix display device in which, even when parasitic capacitance is suppressed by forming a thick insulating film around an organic semiconductor film, disconnection or the like does not occur in the opposing electrode formed on the upper layer of the thick insulating film.

In order to achieve the object described above, in the present invention, an active matrix display device includes a display area having a plurality of scanning lines on a substrates a plurality of data lines extending in the direction orthogonal to the direction of extension of the scanning lines, and a plurality of pixels formed in a matrix by the data lines and the scanning lines. Each of the pixels is provided with a thin film luminescent element having a conduction control circuit which includes a TFT in which scanning signals are supplied to a gate electrode through the scanning lines, a pixel electrode, an organic semiconductor film deposited on the upper layer side of the pixel electrode, and an opposing electrode formed at least over the entire surface of the display area on the upper layer side of the organic semiconductor film. The thin film luminescent element emits light in response to picture signals supplied from the data lines through the conduction control circuit. A region in which the organic semiconductor film is formed is bound by an insulating film formed in the lower layer side of the opposing electrode with a thickness that is larger than that of the organic semiconductor film, and the insulating film is provided with a discontinuities portion for connecting the individual opposing electrode sections of the pixels to each other through a planar section which does not have a step due to the existence of the insulating film.

In the present invention, since the opposing electrode is formed at least on the entire surface of the display area and opposes the data lines, a large amount of capacitance parasitizes the data lines if no measures are taken. In the present invention, however, since a thick insulating film is interposed between the data lines and the opposing electrode, parasitization of capacitance in the data lines can be prevented. As a result, the load on the data side drive circuit can be decreased, resulting in lower consumption of electric power or faster display operation. If a thick insulating film is formed, although the insulating film may form a large step and disconnection may occur in the opposing electrode formed on the upper layer side of the insulating film, in the present invention, a discontinuities portion is configured at a predetermined position of the thick insulating film and this section is planar. Accordingly, the opposing electrodes in the individual regions are electrically connected to each other through a section formed in the planar section, and even if disconnection occurs at a step due to the existence of the insulating film, since electrical connection is secured through the planar section which corresponds to the discontinuities portion of the insulating film, disadvantages resulting from disconnection of the opposing substrate do not occur. Therefore, in the active matrix display device, even if a thick insulating film is formed around the organic semiconductor film to suppress parasitic capacitance and the like, disconnection does not occur in the opposing electrode formed on the upper layer of the insulating film, and thereby display quality and reliability of the active matrix display device can be improved.

In the present invention, preferably, the conduction control circuit is provided with a first TFT in which the scanning signals are supplied to a gate electrode and a second TFT in which a gate electrode is connected to the data line through the first TFT, and the second TFT and the thin film luminescent element are connected in series between the opposing electrode and a common feeder for feeding a driving current formed independently of the data line and the scanning line. That is, although it is possible to configure the conduction control circuit with one TFT and a storage capacitor, in view of an increase in display quality, it is preferable that the conduction control circuit of each pixel be configured with two TFTs and a storage capacitor.

In the present invention, preferably, the insulating film is used as a bank layer for preventing the spread of a discharged liquid when the organic semiconductor film is formed in the area bound by the insulating film by an ink jet process. In such a case, the insulating film preferably has a thickness of 1 $\mu$m or more.

In the present invention, when the insulating film is formed along the data lines and the scanning lines such that the insulating film surrounds a region in which the organic semiconductor film is formed, the discontinuities portion is formed in a section between the adjacent pixels in the direction of extension of the data lines, between the adjacent pixels in the direction of extension of the scanning lines, or between the adjacent pixels in both directions.

In a different manner from the mode described above, the insulating film may extend along the data lines in a strip, and in such a case, the discontinuities portion may be formed on at least one end in the direction of extension.

In the present invention, preferably, in the region in which a pixel electrode is formed, a region overlapping the region in which the conduction control circuit is formed is covered with the insulating film. That is, preferably, in the region in which the pixel electrode is formed, the thick insulating film is opened only at a planar section in which the conduction control circuit is not formed, and the organic semiconductor film is formed only in the interior of this section. In such a configuration, display unevenness due to the layer thickness irregularity of the organic semiconductor film can be prevented. In the region in which the pixel electrode is formed, in a region overlapping the region in which the conduction control circuit is formed, even if the organic semiconductor film emits light because of a driving current applied from the opposing electrode, the light is shielded by the conduction control circuit and does not contribute to the display. The driving current that is applied to the organic semiconductor film in the section which does not contribute to the display is a reactive current in terms of display. In the present invention, the thick insulating film is formed in the section in which such a reactive current should have flowed in the conventional structure, and a driving current is prevented from being applied thereat. As a result, the amount of current applied to the common feeder can be reduced, and by decreasing the width of the common feeder by that amount, the emission area can be increased, thereby display characteristics such as luminance and contrast ratio can be improved.

In the present invention, preferably, an active matrix display device includes a data side drive circuit for supplying data signals through the data lines and a scanning side drive circuit for supplying scanning signals through the scanning lines in the periphery of the display area; the insulating film is also formed on the upper layer side of the scanning side drive circuit and the data side drive circuit, and the insulating film is provided with a discontinuities portion for connecting the opposing electrodes between the display area side and the substrate periphery side through a planar section which does not have a step caused by the existence of the insulating film at the position between the region in which the scanning side drive circuit is formed and the region in which the data side drive circuit is formed. In such a configuration, even if disconnection of the opposing electrode occurs along the periphery of the insulating film that covers the surface of the data side drive circuit and the scanning side drive circuit, the opposing electrode on the display area side and the opposing electrode on the substrate periphery side are connected through the planar section which does not have a step caused by the existence of insulating film, and the electrical connection between the opposing electrode on the display area side and the opposing electrode on the substrate periphery side can be secured.

In the present invention, when the insulating film is composed of an organic material such as a resist film, a thick film can be formed easily. In contrast, when the insulating film is composed of an inorganic material, an alteration in the organic semiconductor film can be prevented even if the insulating film is in contact with the organic semiconductor film.

DETAILED DESCRIPTION OF THE PREFERRED EMBODIMENTS

Figure 13:
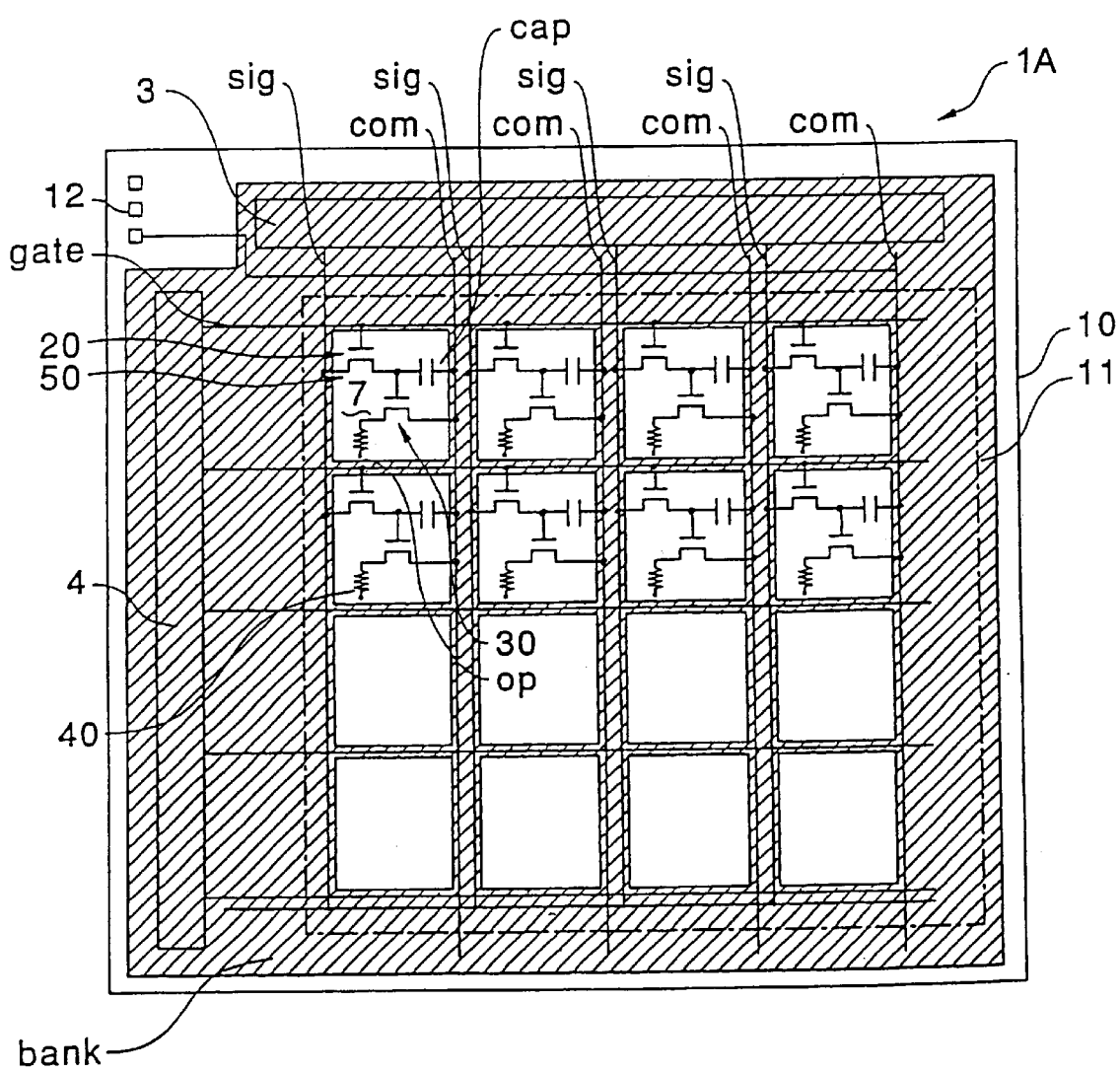
FIG. 13 is a block diagram which schematically shows the general layout of an active matrix display device as a comparative example with respect to the conventional device and a device in accordance with the present invention.
Figure 14:
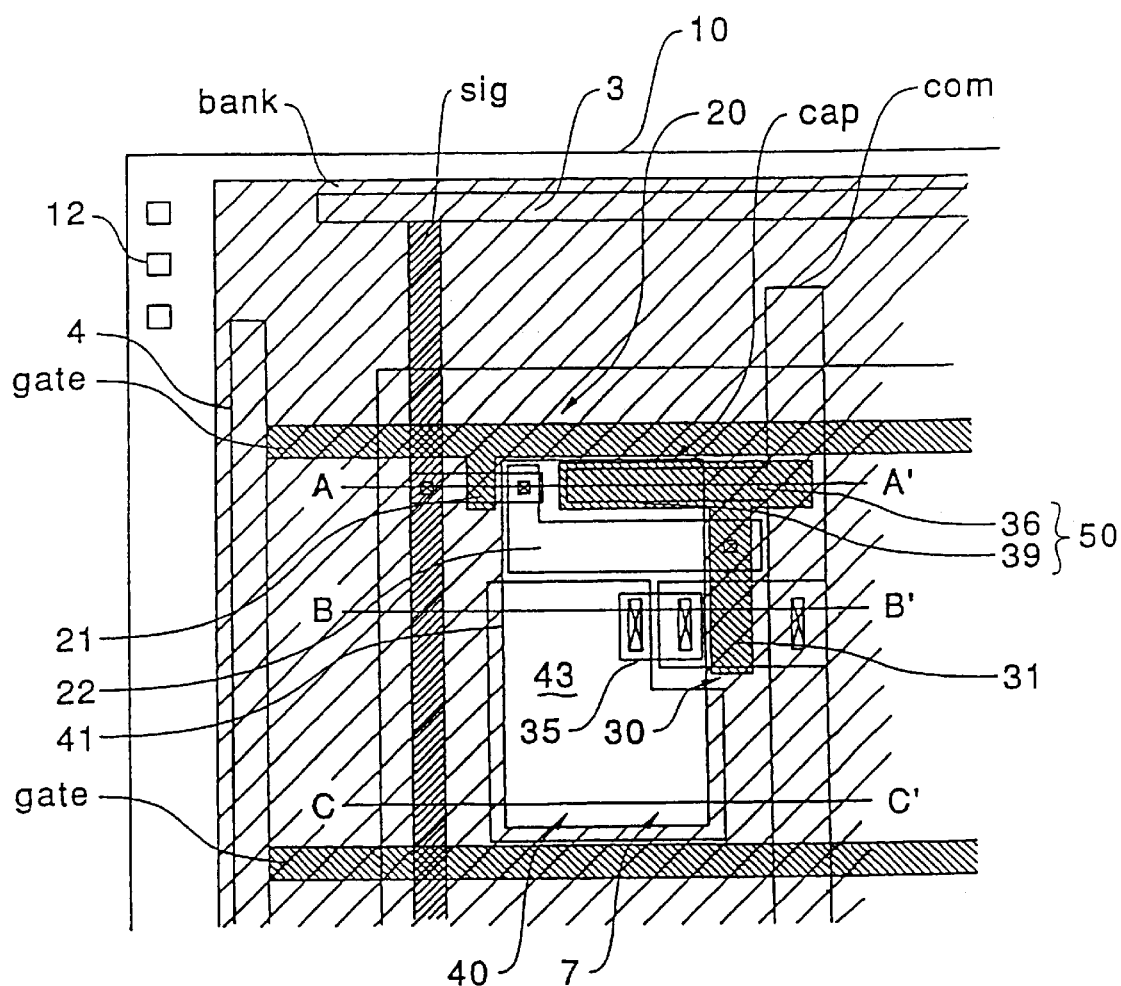
FIG. 14 is a plan view which shows a pixel included in the active matrix display device shown in FIG. 13.
Figure 15A:
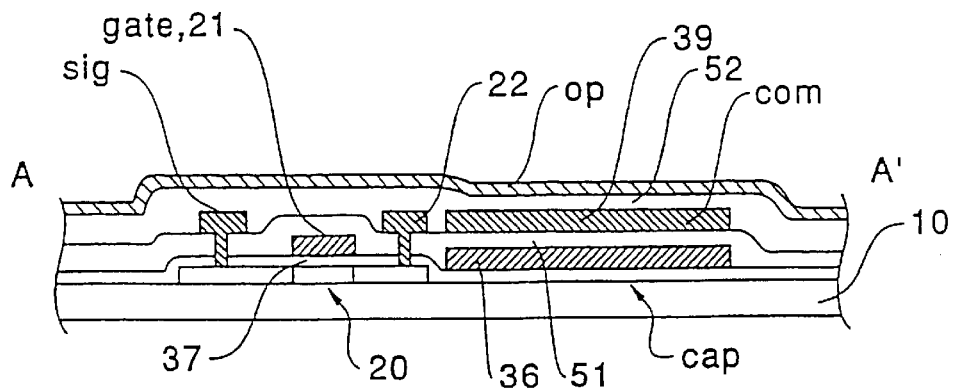
FIGS. 15(A), 15(B), and 15(C) are sectional views taken along the line A–A', the line B–B', and the line C–C' of respectively.
Figure 15B:
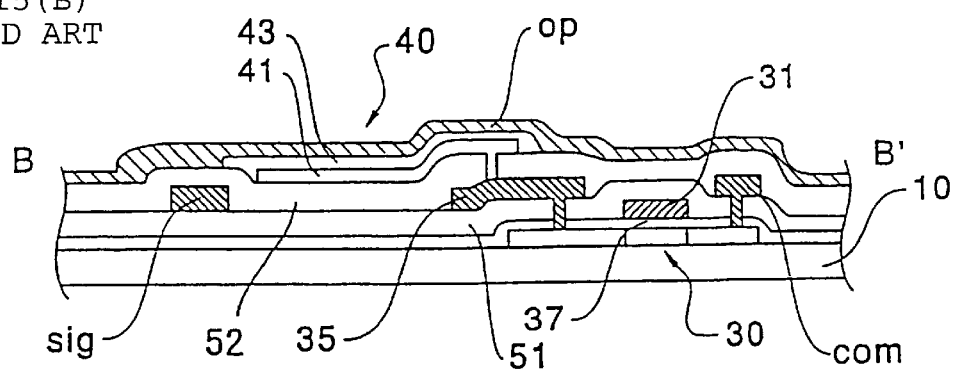
Figure 15C:
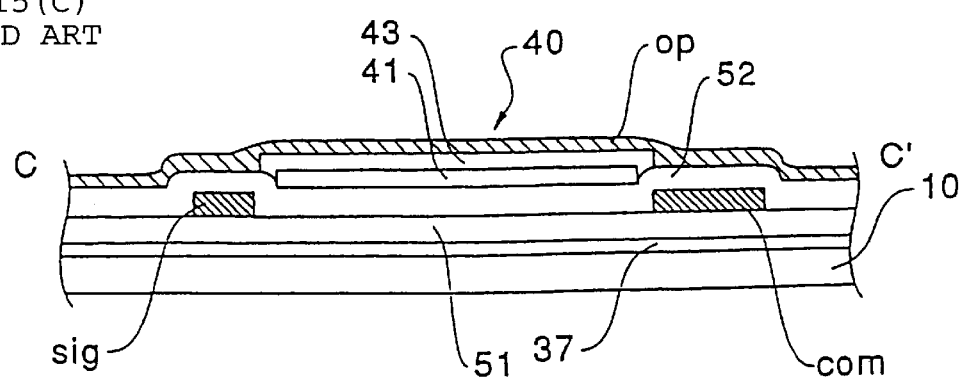
Figure 16A:
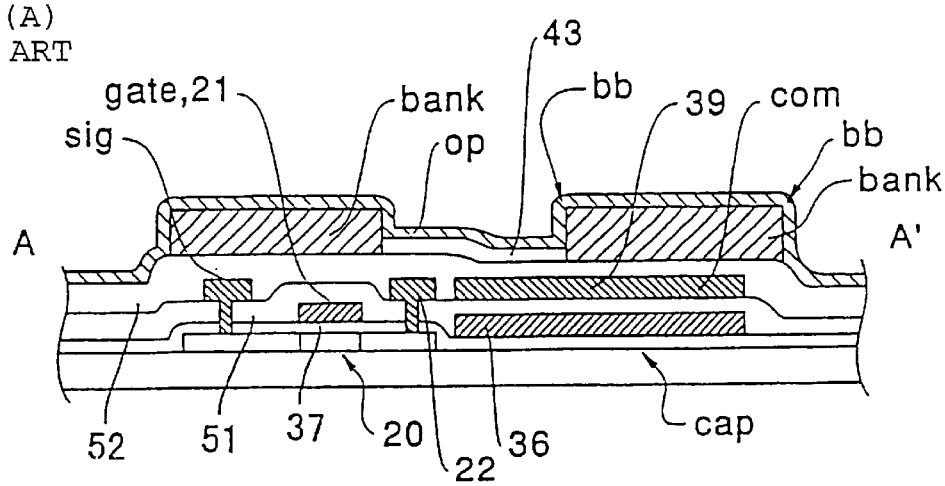
FIGS. 16(A), 16(B), and 16(C) are other sectional views taken along the line A–A', the line B–B', and the line C–C' of FIG. 14, respectively.
Figure 16B:
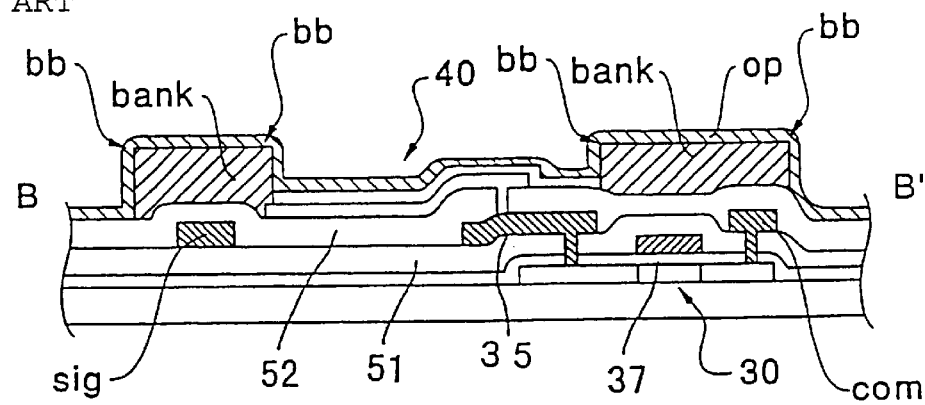
Figure 16C:
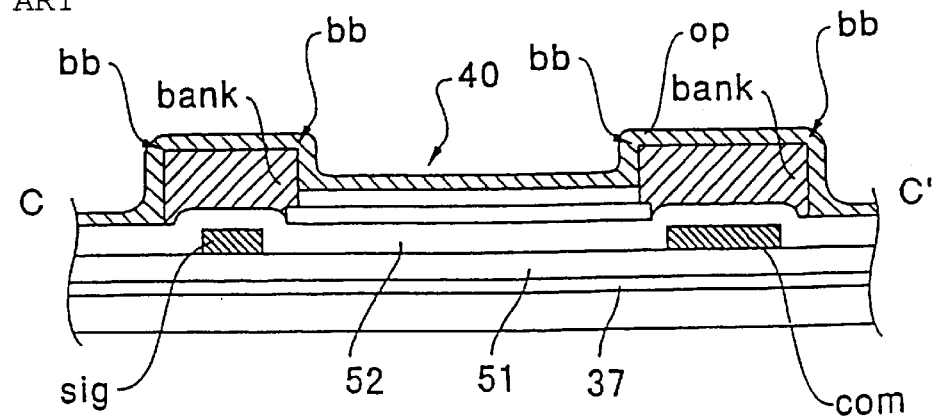

Embodiments of the present invention will be described with reference to the drawings. In the following description, the same reference numerals are used for the elements which are the same as those described in FIG. 13 FIG. 16(C).

Embodiment 1

(General Configuration)

Figure 1:
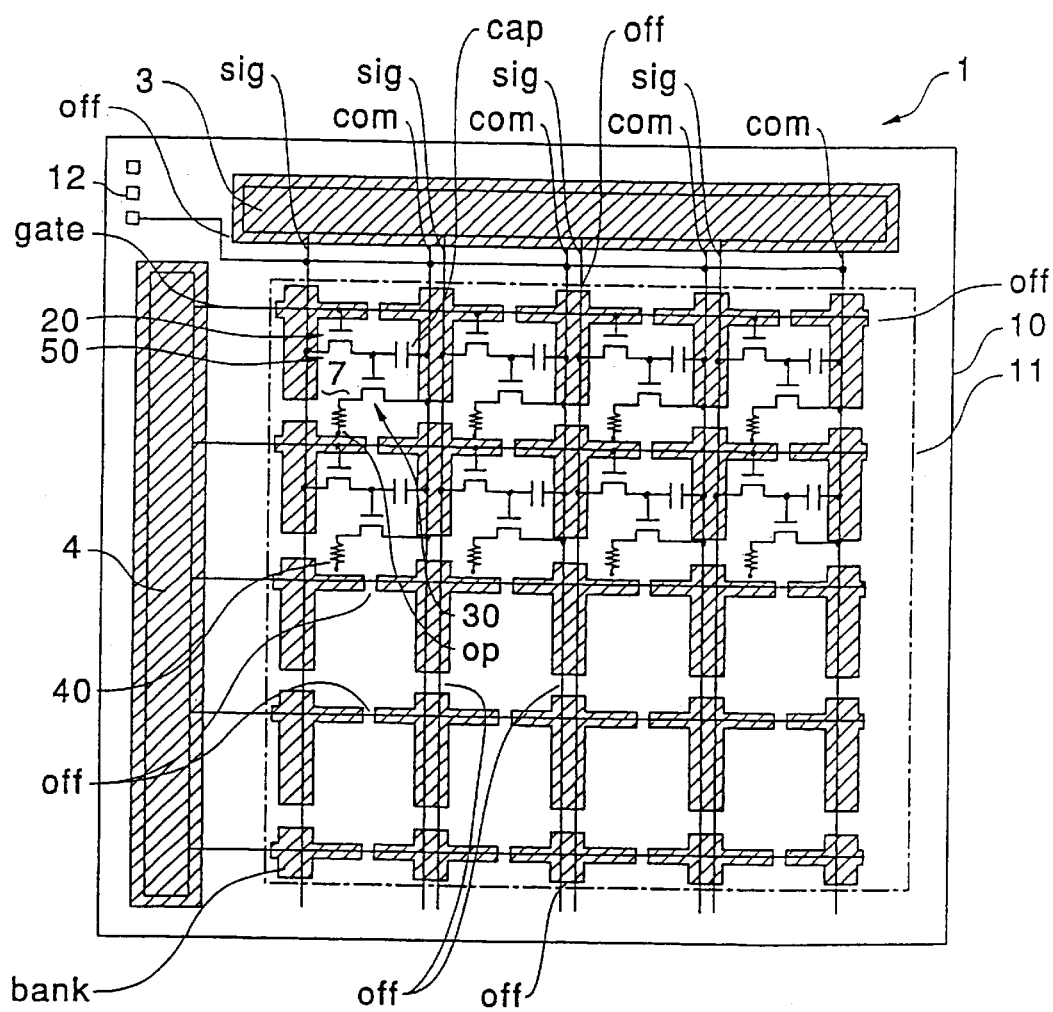
FIG. 1 is a block diagram which schematically shows the general layout of an active matrix display device as embodiment 1 of the present invention.
Figure 2:
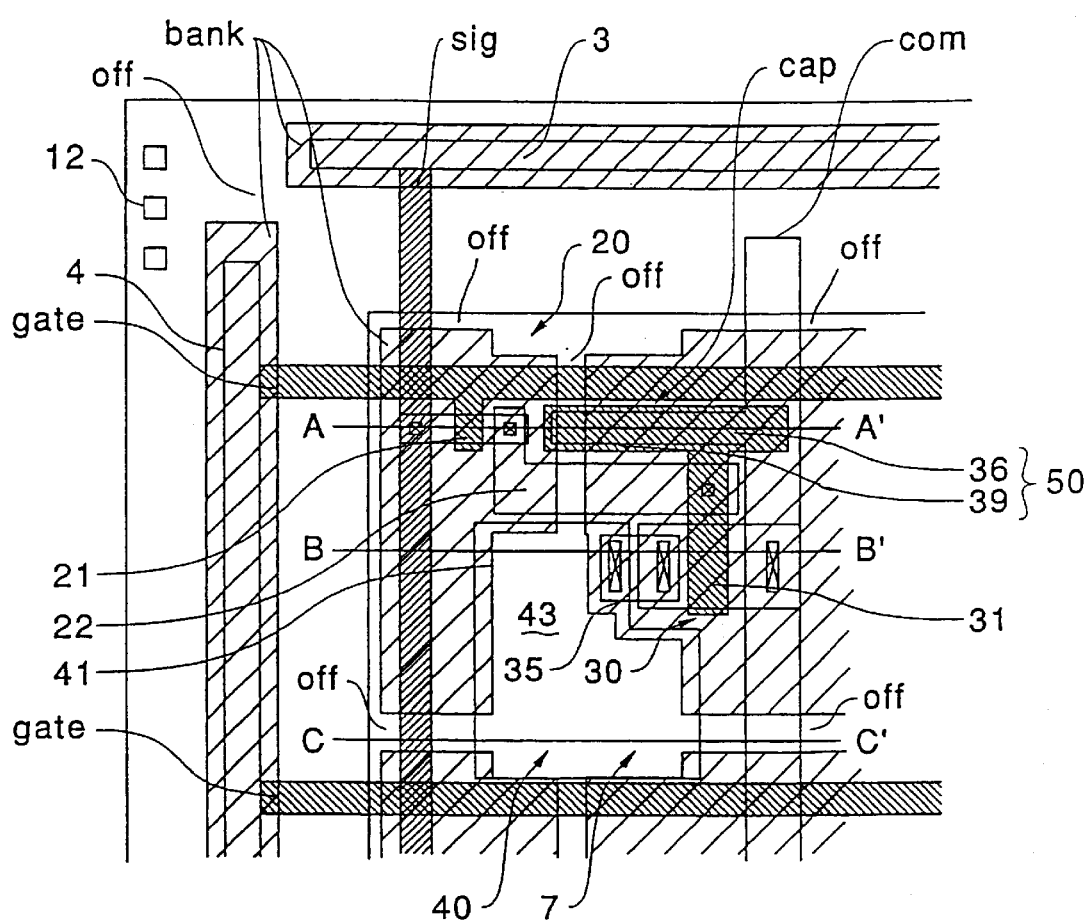
FIG. 2 is a plan view which shows a pixel included in the active matrix display device shown in FIG. 1.
Figure 3A:
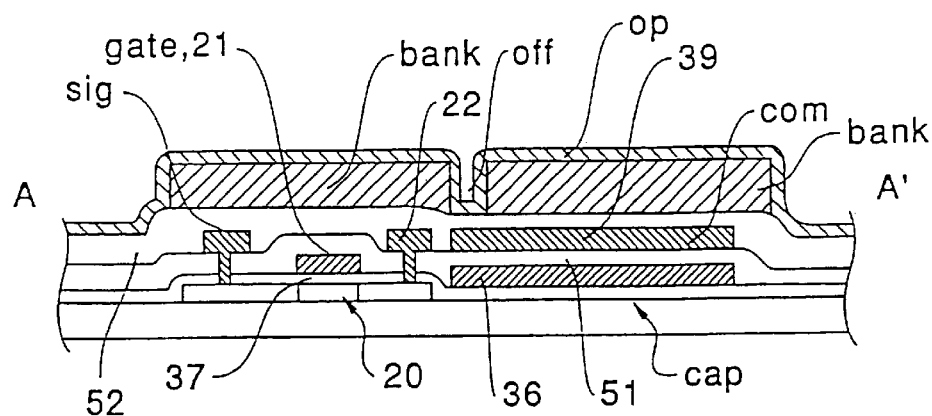
FIGS. 3(A), 3(B), and 3(C) are sectional views taken along the line A–A', the line B–B', and the line C–C' of FIG. 2, respectively.
Figure 3B:
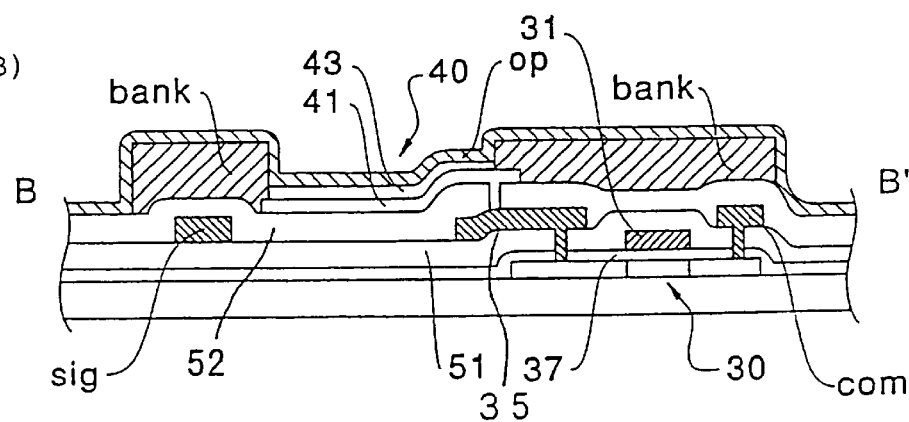
Figure 3C:
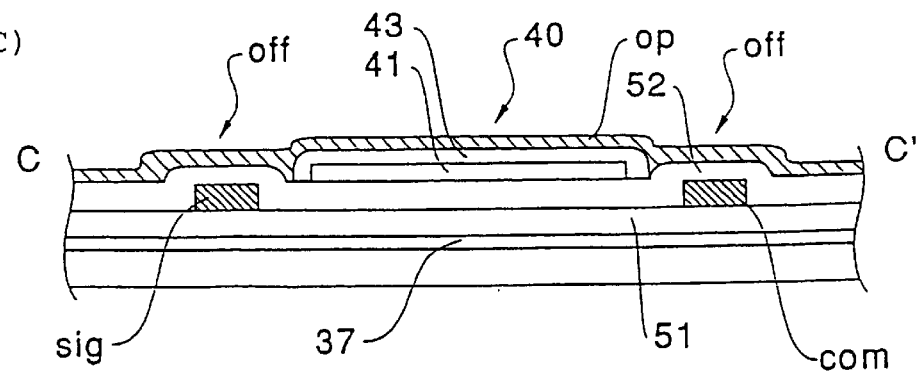

FIG. 1 is a block diagram which schematically shows the general layout of an active matrix display device. FIG. 2 is a plan view which shows a pixel included in the device shown in FIG. 1. FIGS. 3(A), 3(B), and 3(C) are sectional views taken along the line A–A', the line B–B', and the line C–C' of the FIG. 2, respectively.

In an active matrix display device 1 shown in FIG. 1, the central section of a transparent substrate 10 as a base is defined as a display area 11. In the periphery of the transparent substrate 10, a data side drive circuit 3 for outputting picture signals is formed on the end of data lines sig, and a scanning side drive circuit 4 is formed on the end of scanning lines gate. In the drive circuits 3 and 4, complementary TFTs are configured by n-type TFTs and p-type TFTs, and the complementary TFTs constitute a shift register circuit, a level shifter circuit, an analog switch circuit, and the like. In the display area 11, in a manner similar to that in the active matrix substrate in the liquid crystal active matrix display device, on the transparent substrate 10, a plurality of scanning lines gate, a plurality of data lines sig extending in the direction orthogonal to the direction of extension of the scanning lines gate, and a plurality of pixels 7 which are formed in a matrix by the data lines sig and the scanning lines gate are arrayed.

Each of the pixels 7 includes a conduction control circuit 50 to which scanning signals are supplied through a scanning line gate and a thin film luminescent element 40 which emits light in response to picture signals supplied from a data line sig through the conduction control circuit 50. In the example shown here, the conduction control circuit 50 includes a first TFT 20 in which scanning signals are supplied to a gate electrode through the scanning line gate, a storage capacitor cap for retaining picture signals supplied from the data line sig through the first TFT 20, and a second TFT 30 in which picture signals retained by the storage capacitor cap are supplied to a gate electrode. The second TFT 30 and the thin film luminescent element 40 are connected in series between an opposing electrode op (which will be described later in detail) and a common feeder com.

With respect to the active matrix display device 1 having the configuration described above, as shown in FIG. 2 and FIGS. 3(A) and 3(B), in any pixel 7, the first TFT 20 and the second TFT 30 are formed using an island-like semiconductor film (silicon film).

The first TFT 20 has a gate electrode 21 as a portion of the scanning line gate. In the first TFT 20, the data line sig is electrically connected to one of the source and drain regions through a contact hole of a first interlayer insulating film 51, and a drain electrode 22 is electrically connected to the other of the source and drain regions. The drain electrode 22 extends toward the region in which the second TFT 30 is formed, and to this extension, a gate electrode 31 of the second TFT 30 is electrically connected through a contact hole of the first interlayer insulating film 51.

An interconnecting electrode 35 simultaneously formed with the data line sig is electrically connected to one of source and drain regions of the second TFT 30 through a contact hole of the first interlayer insulating film 51, and a transparent pixel electrode 41 composed of an ITO film of the thin film luminescent element 40 is electrically connected to the interconnecting electrode 35 through a contact hole of a second interlayer insulating film 52.

As is clear from FIG. 2 and FIGS. 3(B) and 3(C), the pixel electrode 41 is independently formed for each pixel 7. On the upper layer side of the pixel electrode 41, an organic semiconductor film 43 composed of polyphenylene vinylene (PPV) or the like and the opposing electrode op composed of a metal film such as lithium-containing aluminum or calcium are deposited in that order to form the thin film luminescent element 40. Although the organic semiconductor film 43 is formed in each pixel 7, it may be formed in a strip so as to extend over a plurality of pixels 7. The opposing electrode op is formed on the entire display area 11 and in a region excluding the periphery of a portion in which terminals 12 of the transparent substrate 10 are formed. The terminals 12 include a terminal of the opposing electrode op which is connected to wiring (not shown in the drawing) simultaneously formed with the opposing electrode op.

Additionally, for the thin film luminescent element 40, a structure in which luminous efficiency (hole injection efficiency) is increased by providing a hole injection layer, a structure in which luminous efficiency (electron injection efficiency) is increased by providing an electron injection layer, or a structure in which both a hole injection layer and an electron injection layer are formed, may be employed.

Again, in FIG. 2 and FIG. 3(A), the common feeder com is electrically connected through a contact hole of the first interlayer insulating film 51 to the other one of source and drain regions of the second TFT 30. An extension 39 of the common feeder com opposes an extension 36 of the gate electrode 31 of the second TFT 30 with the first interlayer insulating film 51 as a dielectric film therebetween to form the storage capacitor cap.

As described above, in the active matrix display device 1, when the first TFT 20 is ON by being selected by scanning signals, picture signals from a data line sig are applied to the gate electrode 31 of the second TFT 30 through the first TFT 20, and at the same time, the picture signals are stored in the storage capacitor cap through the first TFT 20. As a result, when the second TFT 30 is ON, a voltage is applied with the opposing electrode op and the pixel electrode 41 serving as a negative pole and a positive pole, respectively, and in the region in which the applied voltage exceeds the threshold voltage, a current (driving current) applied to the organic semiconductor film 43 sharply increases. Accordingly, the luminescent element 40 emits light as an electroluminescence element or an LED element, and light of the luminescent element 40 is reflected from the opposing electrode op and is emitted after passing through the transparent pixel electrode 41 and the transparent substrate 10. Since the driving current for emitting light as described above flows through a current path composed of the opposing electrode op, the organic semiconductor film 43, the pixel electrode 41, the second TFT 30, and the common feeder com, when the second TFT 30 is OFF, the driving current stops flowing. However, in the gate electrode of the second TFT 30, even if the first TFT 20 is OFF, the storage capacitor cap maintains an electric potential that is equivalent to the picture signals, and thereby the second TFT 30 remains ON. Therefore, the driving current continues to be applied to the luminescent element 40, and the pixel stays illuminated. This state is maintained until new image data are stored in the storage capacitor cap and the second TFT 30 is OFF.

(Structure of Bank Layer)

In the active matrix display device 1 having the configuration described above, in this embodiment, in order to prevent the data lines sig from being parasitized with a large amount of capacitance, as shown in FIG. 1, FIG. 2, and FIGS. 3(A), 3(B), and 3(C), a thick insulating film composed of a resist film or polyimide film (bank layer bank, a shaded region in which lines that slant to the left are drawn at a large pitch) is provided along the data lines sig and the scanning lines gate, and the opposing electrode op is formed on the upper layer side of the bank layer bank. Thereby, since the second interlayer insulating film 52 and the thick bank layer bank are interposed between the data line sig and the opposing electrode op, capacitance that parasitizes the data line sig is significantly reduced. Therefore, the load on the drive circuits 3 and 4 can be decreased and lower consumption of electric power or faster display operation can be achieved.

As shown in FIG. 1, the bank layer bank (diagonally shaded region) is also formed in the periphery of the transparent substrate 10 (a region external to the display area 11). Accordingly, both the data side drive circuit 3 and the scanning side drive circuit 4 are covered with the bank layer bank. The opposing electrode op is required to be formed at least on the display area 11, and is not required to be formed in drive circuit regions. However, since the opposing electrode op is generally formed by mask-sputtering, alignment accuracy is low and the opposing electrode op may sometimes overlap drive circuits. However, in this embodiment, even if the opposing electrode op overlaps the region in which the drive circuits are formed, the bank layer bank is interposed between the lead layer of the drive circuits and the opposing electrode op. Therefore, the parasitization of capacitance in the drive circuits 3 and 4 can be prevented, thereby the load on the drive circuits 3 and 4 can be decreased, and lower consumption of electric power or faster display operation can be achieved.

Further, in this embodiment, in the region in which the pixel electrode 41 is formed, in a region in which the conduction control circuit 50 overlaps the interconnecting electrode 35, the bank layer bank is also formed. Therefore, the organic semiconductor film 43 is not formed in the region overlapping with the interconnecting electrode 35. That is, since the organic semiconductor film 43 is formed only in the planar section in the region in which the pixel electrode 41 is formed, the organic semiconductor film 43 is formed at a given thickness, and display unevenness does not occur. If there is no bank layer bank in the region overlapping with the interconnecting electrode 35, a driving current flows between this section and the opposing electrode op, and the organic semiconductor film 43 emits light. However, the light sandwiched between the interconnecting electrode 35 and the opposing electrode op, is not emitted externally, and does not contribute to display. Such a driving current which flows in the section that does not contribute to display is a reactive current in view of display. However, in this embodiment, the bank layer bank is formed in the section in which such a reactive current should have flowed in the conventional structure, and a driving current is prevented from being applied thereat; a useless current can thereby be prevented from flowing through the common feeder con. Therefore, the width of the common feeder com can be decreased by that amount. As a result, the emission area can be increased, and thereby display characteristics such as luminance and contrast ratio can be improved.

Moreover, in this embodiment, since the bank layer bank is formed along the data lines sig and the scanning lines gate, any pixel 7 is surrounded by the thick bank layer bank. Thereby, if no measures are taken, the opposing electrode op of each pixel 7 is connected to the opposing electrode op of the adjacent pixel 7 by extending over the bank layer bank. In this embodiment, however, a discontinuities portion off is formed in the bank layer bank at the section corresponding to a section between the adjacent pixels 7 in the direction of extension of the data line sig. A discontinuities portion off is also formed in the bank layer bank at the section corresponding to a section between the adjacent pixels 7 in the direction of extension of the scanning line gate. Further, a discontinuities portion off is also formed in the bank layer bank at each end of the data lines sig and the scanning lines gate in each of the directions of extension.

Since such a discontinuities portion off does not have the thick bank layer bank, it is a planar section which does not have a large step due to the existence of the bank layer bank, and the opposing electrode op formed in this section does not suffer from disconnection. Thereby, the opposing electrode 7 of each pixel 7 is securely connected to each other through the planar section which does not have a step due to the existence of the bank layer bank. Therefore, even if a thick insulating layer (bank layer bank) is formed around the pixel 7 to suppress parasitic capacitance and the like, disconnection does not occur in the opposing electrode op formed on the upper layer of the thick insulating film (bank layer bank).

Moreover, the bank layer bank formed on the upper layer side of the scanning side drive circuit 4 and the data side drive circuit 3 is provided with a discontinuities portion off at the position between the region in which the scanning side drive circuit 4 is formed and the region in which the data side drive circuit 3 is formed. Thereby, the opposing electrode op on the side of the display area 11 and the opposing electrode op in the periphery of the substrate are connected through the discontinuities portion off of the bank layer bank, and this discontinuities portion is also a planar section which does not have a step due to the existence of the bank layer bank. Accordingly, since the opposing electrode op formed in the discontinuities portion off is not disconnected, the opposing electrode op on the side of the display area 11 and the opposing electrode op in the periphery of the substrate are securely connected through the discontinuities portion off of the bank layer bank, and the terminals 12 that are wired and connected to the opposing electrode op in the periphery of the substrate and the opposing electrode op in the display area 11 are securely connected.

If the bank layer bank is formed of a black resist, the bank layer bank functions as a black matrix, resulting in improvement in display quality such as the contrast ratio. That is, in the active matrix display device 1 of this embodiment, since the opposing electrode op is formed over the entire surface of the pixel 7 on the face side of the transparent substrate 10, reflected light from the opposing electrode op decreases contrast ratio. However, if the bank layer bank that functions as a preventer of parasitic capacitance is composed of a black resist, the bank layer bank also functions as a black matrix and shields the reflected light from the opposing electrode op, resulting in improvement in contrast ratio.

(Method for Fabricating Active Matrix Display Device)

Since the bank layer bank formed as described above is configured so as to surround the region in which the organic semiconductor film 43 is formed, when the organic semiconductor film 43 is formed of a liquid material (discharged liquid) discharged from an ink jet head in the fabricating process of the active matrix display device, the bank layer bank blocks the discharged liquid and prevents the discharged liquid from spreading to the sides. In the method for fabricating the active matrix display device 1 described below, since the steps up to the fabrication of the first TFT 20 and the second TFT 30 on the transparent substrate 10 are substantially the same as those for fabricating the active matrix substrate of the liquid crystal active matrix display device 1, the outline will be briefly described with reference to FIGS. 3(A), 3(B), and 3(C).

First, on the transparent substrate 10, as required, a protective film (not shown in the drawing) composed of a silicon oxide film having a thickness of approximately 2,000 to 5,000 angstroms is formed by a plasma CVD process using TEOS (tetraethoxysilane) or oxygen gas as a source gas, and then on the surface of the protective film, a semiconductor film composed of an amorphous silicon film having a thickness of approximately 300 to 700 angstroms is formed by a plasma CVD process. Next, the semiconductor film composed of the amorphous silicon film is subjected to a crystallization step such as laser-annealing or solid phase epitaxy to crystallize the semiconductor film into a polysilicon film.

Next, the island-like semiconductor film is formed by patterning the semiconductor film, and on the surface thereof, a gate insulating film 37 composed of a silicon oxide film or nitride film having a thickness of approximately 600 to 1,500 angstroms is formed by a plasma CVD process using TEOS (tetraethoxysilane) or oxygen gas as a source gas.

Next, a conductive film composed of a metal film such as aluminum, tantalum, molybdenum, titanium, or tungsten is formed by sputtering and is then patterned to form gate electrodes 21 and 31, and an extension 36 of the gate electrode 31 (gate electrode formation step). In this step, scanning lines gate are also formed.

In this state, source and drain regions are formed in a self-aligned manner with respect to the gate electrodes 21 and 31 by implanting high-concentration phosphorus ions. The section in which impurities are not implanted becomes a channel region.

Next, after the first interlayer insulating film 51 is formed, the individual contact holes are formed. Then, the data line sig, the drain electrode 22, the common feeder com, the extension 39 of the common feeder con, and the interconnecting electrode 35 are formed. As a result, the first TFT 20, the second TFT 30, and the storage capacitor cap are formed.

Next, the second interlayer insulating film 52 is formed, and a contact hole is formed in the interlayer insulating film at the section corresponding to the interconnecting electrode 35. Then, after an ITO film is formed on the entire surface of the second interlayer insulating film 52, by patterning, the pixel electrode 41 that is electrically connected to the source/drain region of the second TFT 30 through the contact hole is formed in each pixel 7.

Next, after a resist layer is formed on the surface side of the second interlayer insulating film 52, the resist layer is patterned so as to remain along the scanning line gate and the data line sig to form the bank layer bank. A discontinuities portion off is formed at a predetermined section of the bank layer bank. At this stage, the resist section to be left along the data line sig is formed broadly so as to cover the common feeder com. As a result, the region in which the organic semiconductor film 43 of the luminescent element 40 is to be formed is surrounded by the bank layer bank.

Next, in the region bound in a matrix by the bank layer bank, the individual organic semiconductor films 43 corresponding to R, G, and B are formed using an ink jet process. To this end, a liquid material (precursor) for constituting the organic semiconductor film 43 is discharged from an ink jet head to the interior region of the bank layer bank, and is fixed in the interior region of the bank layer bank to form the organic semiconductor film 43. The bank layer bank is water-repellent because it is composed of a resist layer. In contrast, since the precursor of the organic semiconductor film 43 uses a hydrophilic solvent, even if there is a discontinuities portion off in the bank layer bank that bounds the region in which the organic semiconductor film 43 is formed, since such a discontinuities portion off is narrow, the region in which the organic semiconductor film 43 is applied is securely defined by the bank layer bank and spreading to the adjacent pixel 7 does not occur. Therefore, the organic semiconductor film 43, etc., can be formed only within the predetermined region. In this step, since the precursor discharged from the ink jet head swells to a thickness of approximately 2 to 4 µm under the influence of surface tension, the bank layer bank must have a thickness of approximately 1 to 3 µm. The fixed organic semiconductor film 43 has a thickness of approximately 0.05 to 0.2 µm. Additionally, when the barrier of the bank layer bank has a height of 1µm or more, even if the bank layer bank is not water repellent, the bank layer bank functions satisfactorily as a barrier. By forming such a thick bank layer bank, the region in which the organic semiconductor film 43 is formed can be defined when the film 43 is formed by an application process instead of the ink jet process.

Then, the opposing electrode op is formed substantially on the entire surface of the transparent substrate 10.

In accordance with the fabrication method described above, since the individual organic semiconductor films 43 corresponding to R, G, and B can be formed in the predetermined region using the ink jet process, the full color active matrix display device 1 can be fabricated with high productivity.

Additionally, although TFTs are also formed in the data side drive circuit 3 and the scanning side drive circuit 4 shown in FIG. 1, the TFTs are formed entirely or partially by repeating the steps of forming the TFTs in the pixel 7 described above. Therefore, TFTs included in the drive circuits are formed between the same layers as those of the TFTs of the pixel 7. With respect to the first TFT 20 and the second TFT 30, both may be n-type or p-type, or one may be n-type and the other may be p-type. In any combination, since TFTs can be formed in a known manner, description thereof will be omitted.

Variation 1 of Embodiment 1

Figure 4:
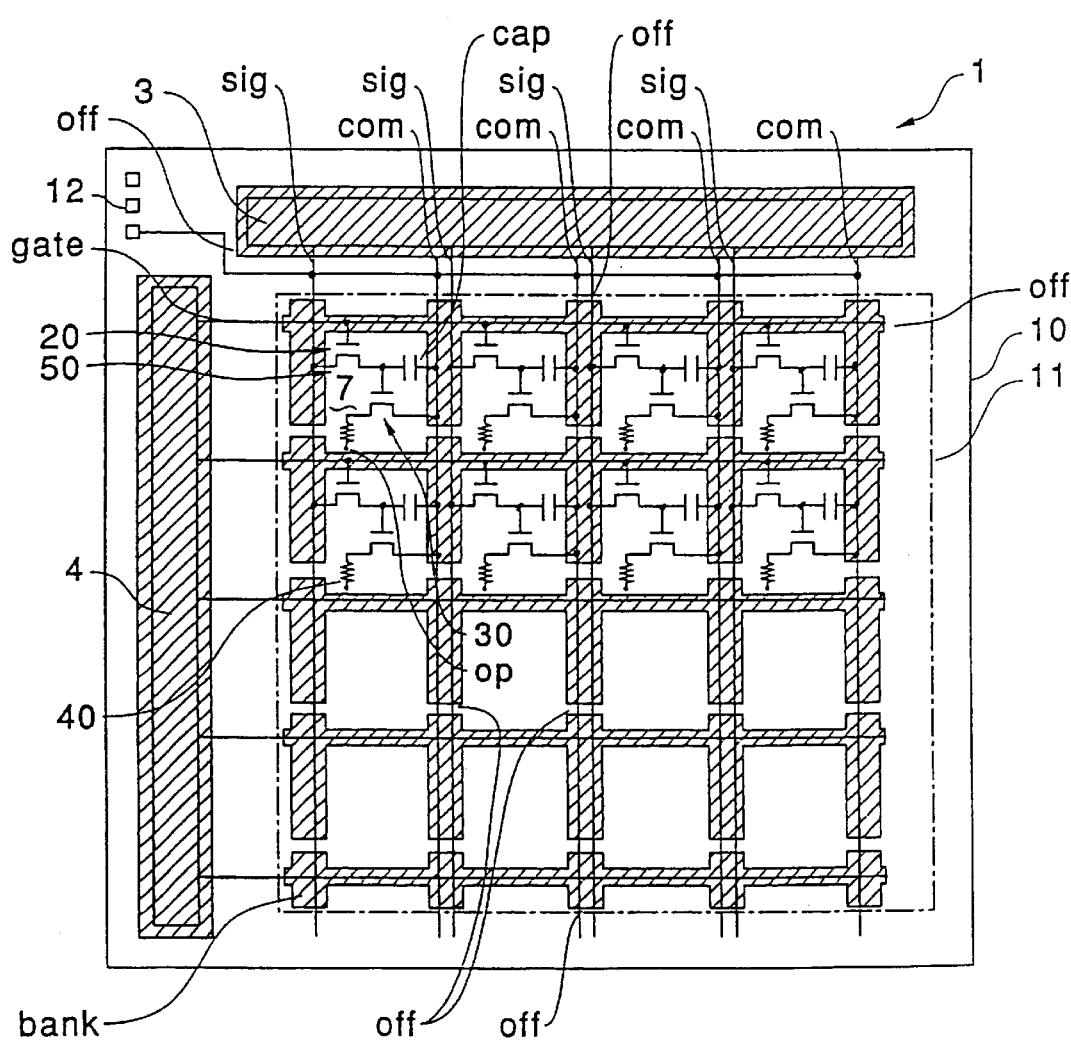
FIG. 4 is a block diagram which schematically shows the general layout of an active matrix display device as variation 1 of the embodiment 1 of the present invention.
Figure 5:
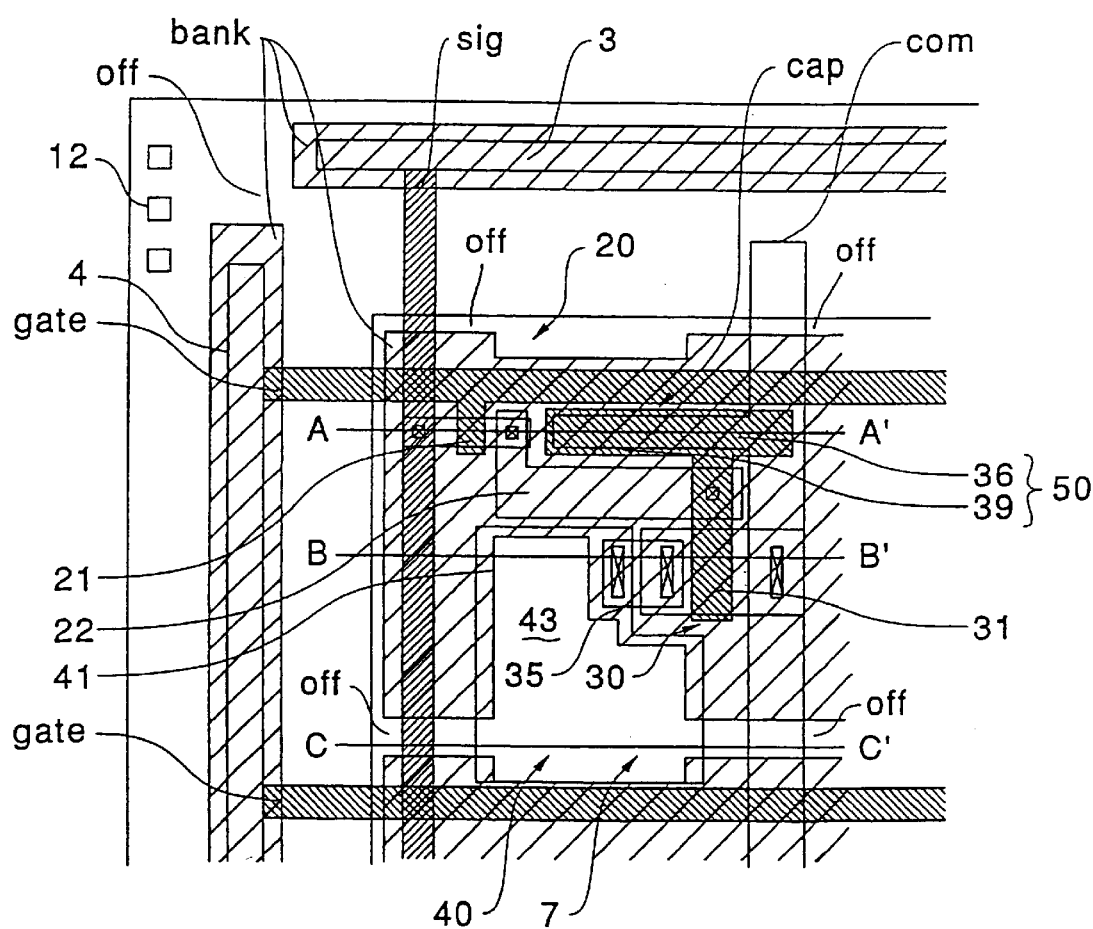
FIG. 5 is a plan view which shows a pixel included in the active matrix display device shown in FIG. 4.
Figure 6A:
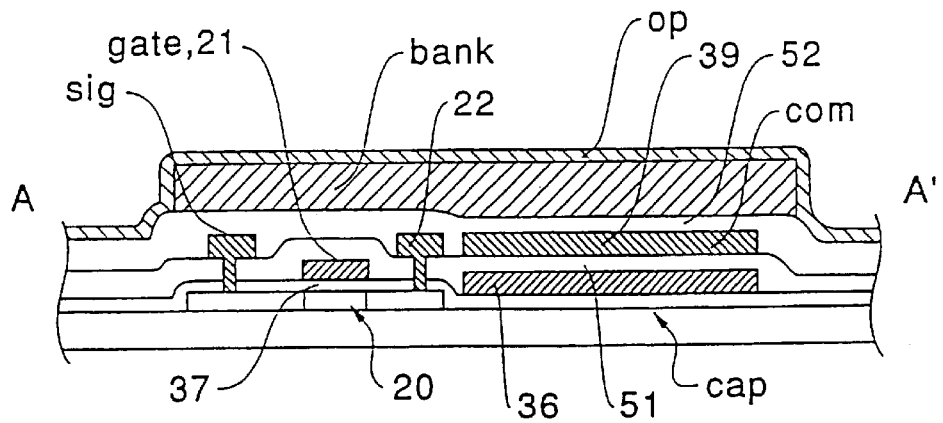
FIGS. 6(A), 6(B), and 6(C) are sectional views taken along the line A–A', the line B–B', and the line C–C' of FIG. 5, respectively.
Figure 6B:
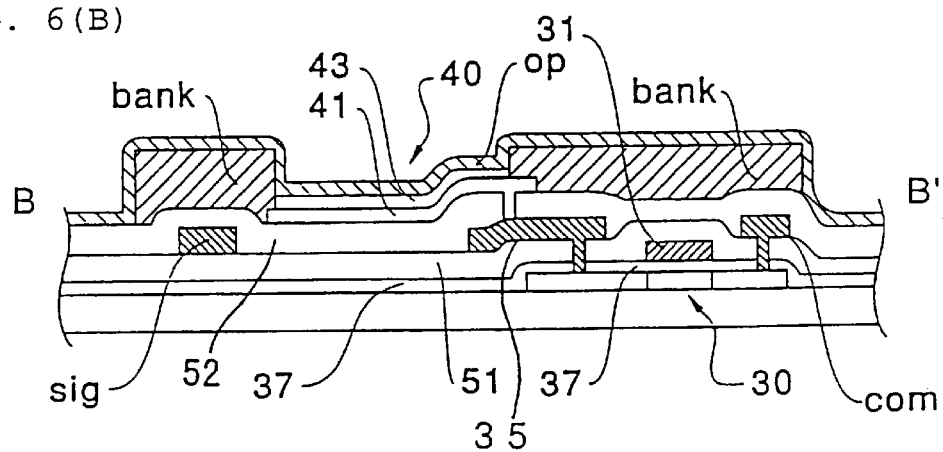
Figure 6C:
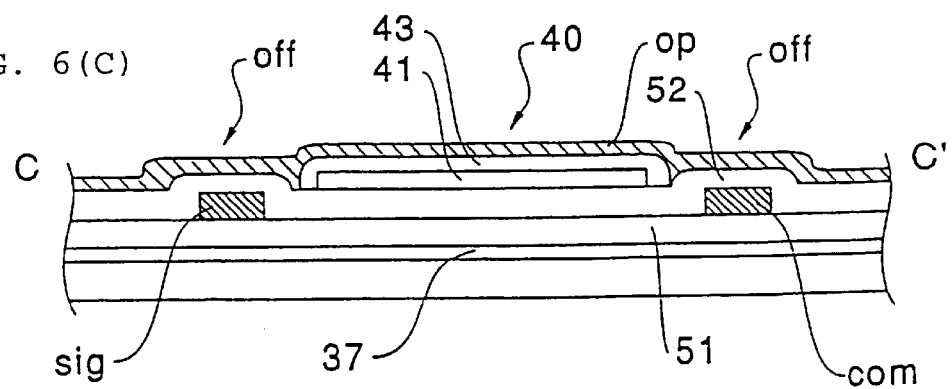

FIG. 4 is a block diagram which schematically shows the general layout of an active matrix display device. FIG. 5 is a plan view which shows a pixel included in the device shown in FIG. 4. FIGS. 6(A), 6(B), and 6(C) are sectional views taken along the line A–A', the line B–B', and the line C–C' of FIG. 5, respectively. Since this embodiment has basically the same configuration as that of embodiment 1, the same reference numerals are used for the parts that are the same as those of embodiment 1, and detailed description thereof will be omitted.

As shown in FIG. 4, FIG. 5, and FIGS. 6(A), 6(B), and 6(C), in an active matrix display device 1 of this embodiment, a thick insulating film composed of a resist film (bank layer bank, a shaded region in which lines that slant to the left are drawn at a large pitch) is also provided along the data lines sig and the scanning lines gate, and the opposing electrode op is formed on the upper layer side of the bank layer bank. Thereby, since the second interlayer insulating film 52 and the thick bank layer bank are interposed between the data line sig and the opposing electrode op, the capacitance that parasitizes the data line sig is significantly reduced. Therefore, the load on the drive circuits 3 and 4 can be decreased and lower consumption of electric power or faster display operation can be achieved.

The bank layer bank (diagonally shaded region) is also formed in the periphery of the transparent substrate 10 (a region external to the display area 11). Accordingly, both the data side drive circuit 3 and the scanning side drive circuit 4 are covered with the bank layer bank. Even if the opposing electrode op overlaps the region in which the drive circuits are formed, the bank layer bank is interposed between the wiring layer of the drive circuits and the opposing electrode op. Therefore, the parasitization of capacitance in the drive circuits 3 and 4 can be prevented, and thus the load on the drive circuits 3 and 4 can be decreased, and lower consumption of electric power or faster display operation can be achieved.

Further, in this embodiment, in the region in which the pixel electrode 41 is formed, in a region in which the conduction control circuit 50 overlaps the interconnecting electrode 35, the bank layer bank is also formed, and thereby a useless reactive current can be prevented from flowing. Therefore, the width of the common feeder com can be decreased by that amount.

Moreover, in this embodiment, since the bank layer bank is formed along the data lines sig and the scanning lines gate, any pixel 7 is surrounded by the bank layer bank. Therefore, since the individual organic semiconductor films 43 corresponding to R, G, and B can be formed in the predetermined region using an ink jet process, the full color active matrix display device 1 can be fabricated with high productivity.

Moreover, a discontinuities portion off is formed in the bank layer bank at the section corresponding to a section between the adjacent pixels 7 in the extending direction of the scanning lines gate. A discontinuities portion off is also formed in the bank layer bank at each end of the data lines sig and the scanning lines gate in each of the extending directions. Further, the bank layer bank formed on the upper layer side of the scanning side drive circuit 4 and the data side drive circuit 3 is provided with a discontinuities portion off at the position between the region in which the scanning side drive circuit 4 is formed and the region in which the data side drive circuit 3 is formed. Accordingly, the opposing electrodes op are securely connected to each other through a planar section (discontinuities portion off) which does not have a step due to the existence of the bank layer bank, and disconnection does not occur.

Variation 2 of Embodiment 1

Figure 7:
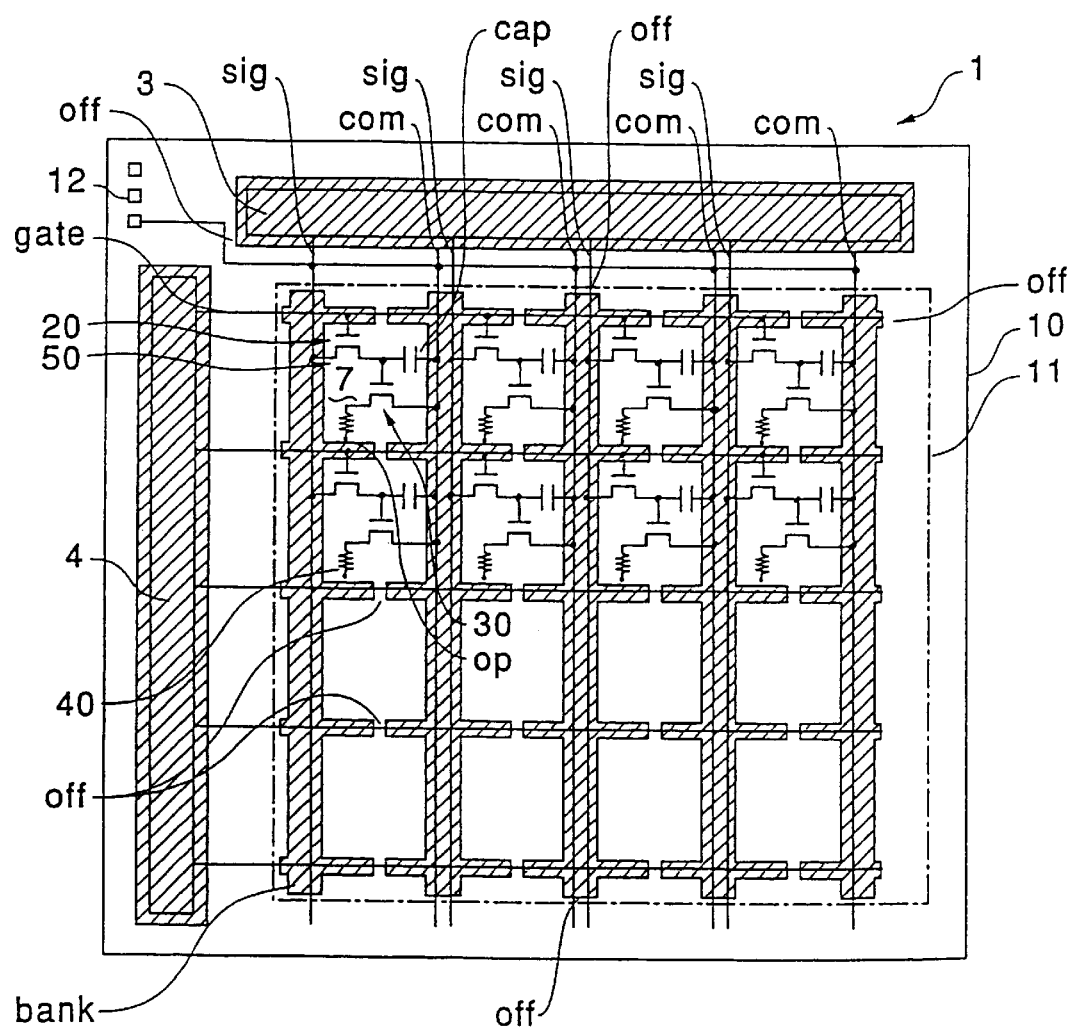
FIG. 7 is a block diagram which schematically shows the general layout of an active matrix display device as variation 2 of the embodiment 1 of the present invention.
Figure 8:
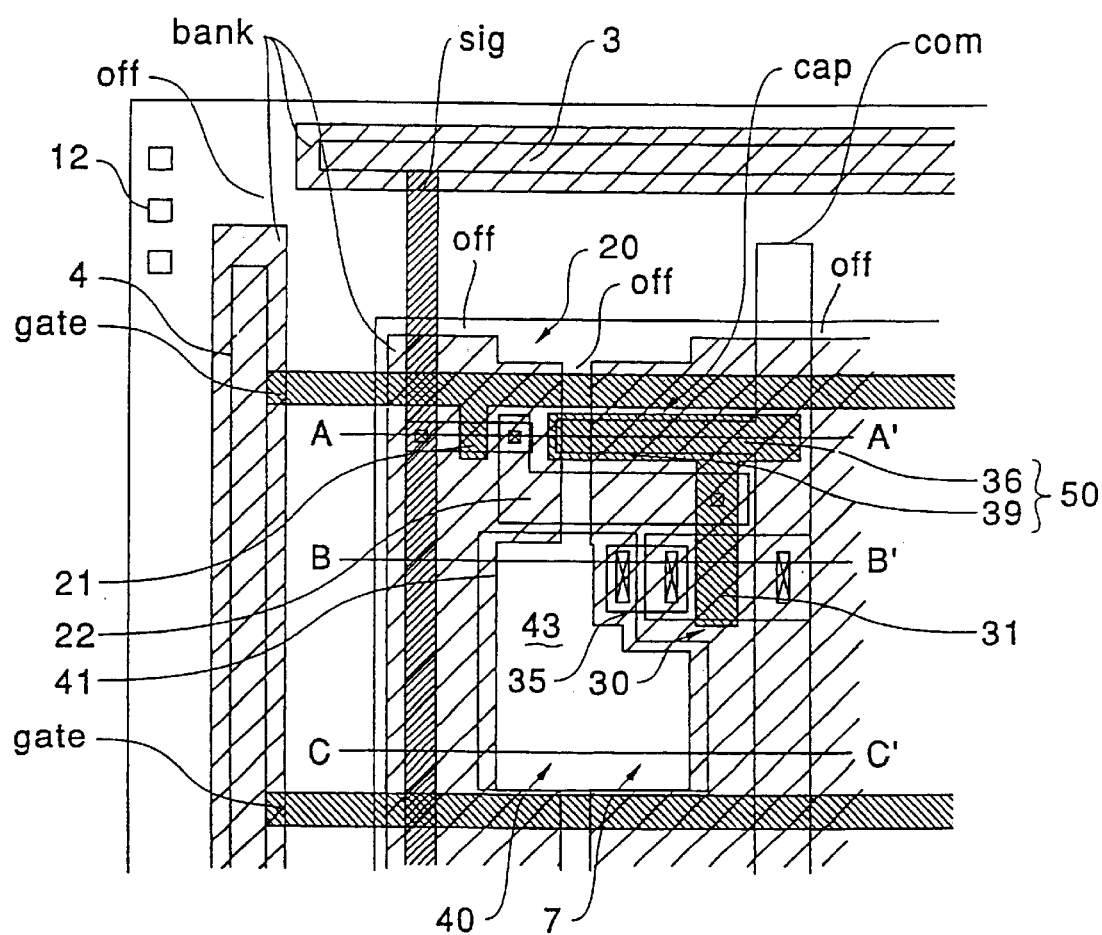
FIG. 8 is a plan view which shows a pixel included in the active matrix display device shown in FIG. 7.
Figure 9A:
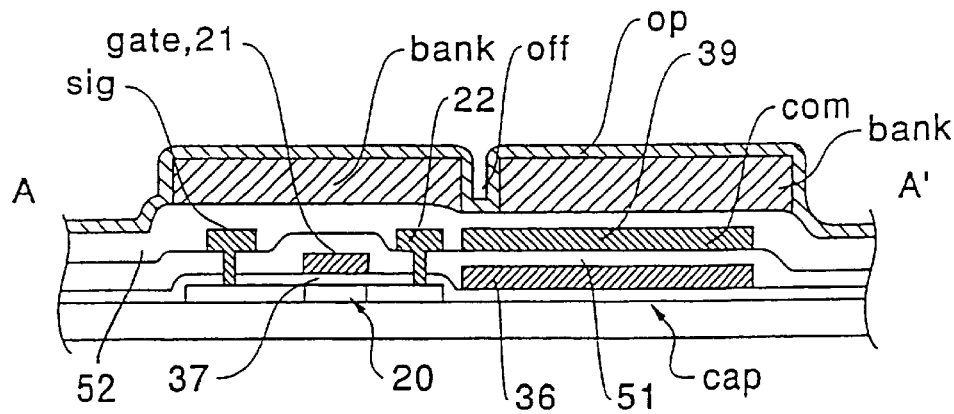
FIGS. 9(A), 9(B), and 9(C) are sectional views taken along the line A–A', the line B–B', and the line C–C' of FIG. 8, respectively.
Figure 9B:
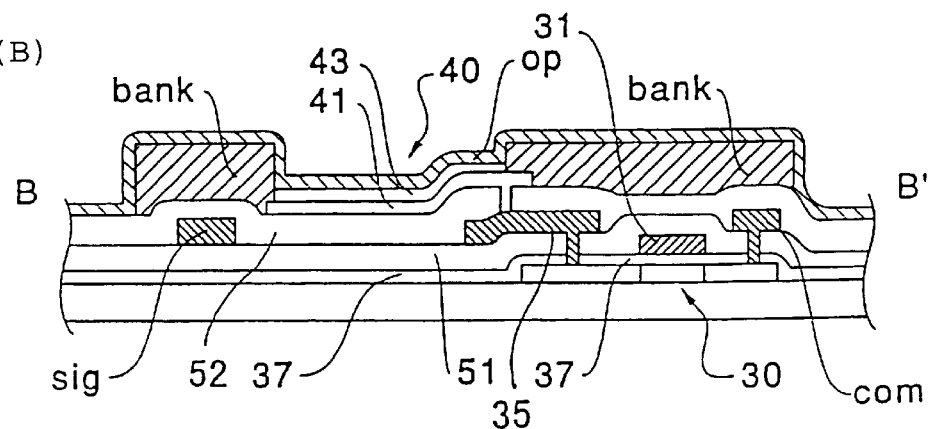
Figure 9C:
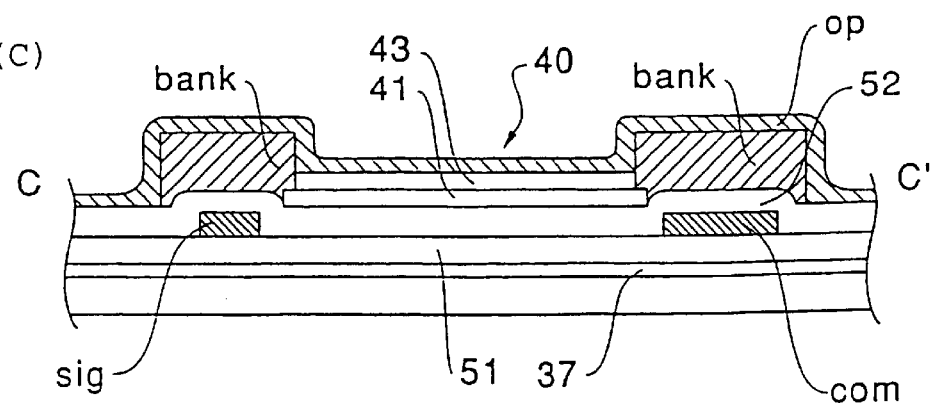

FIG. 7 is a block diagram which schematically shows the general layout of an active matrix display device. FIG. 8 is a plan view which shows a pixel included in the device shown in FIG. 7. FIGS. 9(A), 9(B), and 9(C) are sectional views taken along the line A–A', the line B–B', and the line C–C' of FIG. 8, respectively. Since this embodiment has basically the same configuration as that of embodiment 1, the same reference numerals are used for the parts that are the same as those of embodiment 1, and detailed description thereof will be omitted.

As shown in FIG. 7, FIG. 8, and FIGS. 9(A), 9(B), and 9(C), in an active matrix display device 1 of this embodiment, a thick insulating film composed of a resist film (bank layer bank, a shaded region in which lines that slant to the left are drawn at a large pitch) is also provided along the data lines sig and the scanning lines gate, and the opposing electrode op is formed on the upper layer side of the bank layer bank. Thereby, since the second interlayer insulating film 52 and the thick bank layer bank are interposed between the data line sig and the opposing electrode op, the capacitance that parasitizes the data line sig is significantly reduced. Therefore, the load on the drive circuits 3 and 4 can be decreased and lower consumption of electric power or faster display operation can be achieved.

The bank layer bank (diagonally shaded region) is also formed in the periphery of the transparent substrate 10 (a region external to the display area 11). Accordingly, both the data side drive circuit 3 and the scanning side drive circuit 4 are covered with the bank layer bank. Even if the opposing electrode op overlaps the region in which the drive circuits are formed, the bank layer bank is interposed between the wiring layer of the drive circuits and the opposing electrode op. Therefore, the parasitization of capacitance in the drive circuits 3 and 4 can be prevented, and thus the load on the drive circuits 3 and 4 can be decreased, and lower consumption of electric power or faster display operation can be achieved.

Further, in this embodiment, in the region in which the pixel electrode 41 is formed, in a region in which the conduction control circuit 50 overlaps the interconnecting electrode 35, the bank layer bank is also formed, and thereby a useless reactive current can be prevented from flowing. Therefore, the width of the common feeder com can be decreased by that amount.

Moreover, in this embodiment, since the bank layer bank is formed along the data lines sig and the scanning lines gate, any pixel 7 is surrounded by the bank layer bank. Therefore, since the individual organic semiconductor films 43 corresponding to R, G, and B can be formed in the predetermined region using an ink jet process, the full color active matrix display device 1 can be fabricated with high productivity.

Moreover, a discontinuities portion off is formed in the bank layer bank at the section corresponding to a section between the adjacent pixels 7 in the extending direction of the data lines sig. A discontinuities portion off is also formed in the bank layer bank at each end of the data lines sig and the scanning lines gate in each of the extending directions. Further, the bank layer bank formed on the upper layer side of the scanning side drive circuit 4 and the data side drive circuit 3 is provided with a discontinuities portion off at the position between the region in which the scanning side drive circuit 4 is formed and the region in which the data side drive circuit 3 is formed. Accordingly, the opposing electrodes op are securely connected to each other through a planar section (discontinuities portion off) which does not have a step due to the existence of the bank layer bank, and disconnection does not occur.

Embodiment 2

Figure 10:
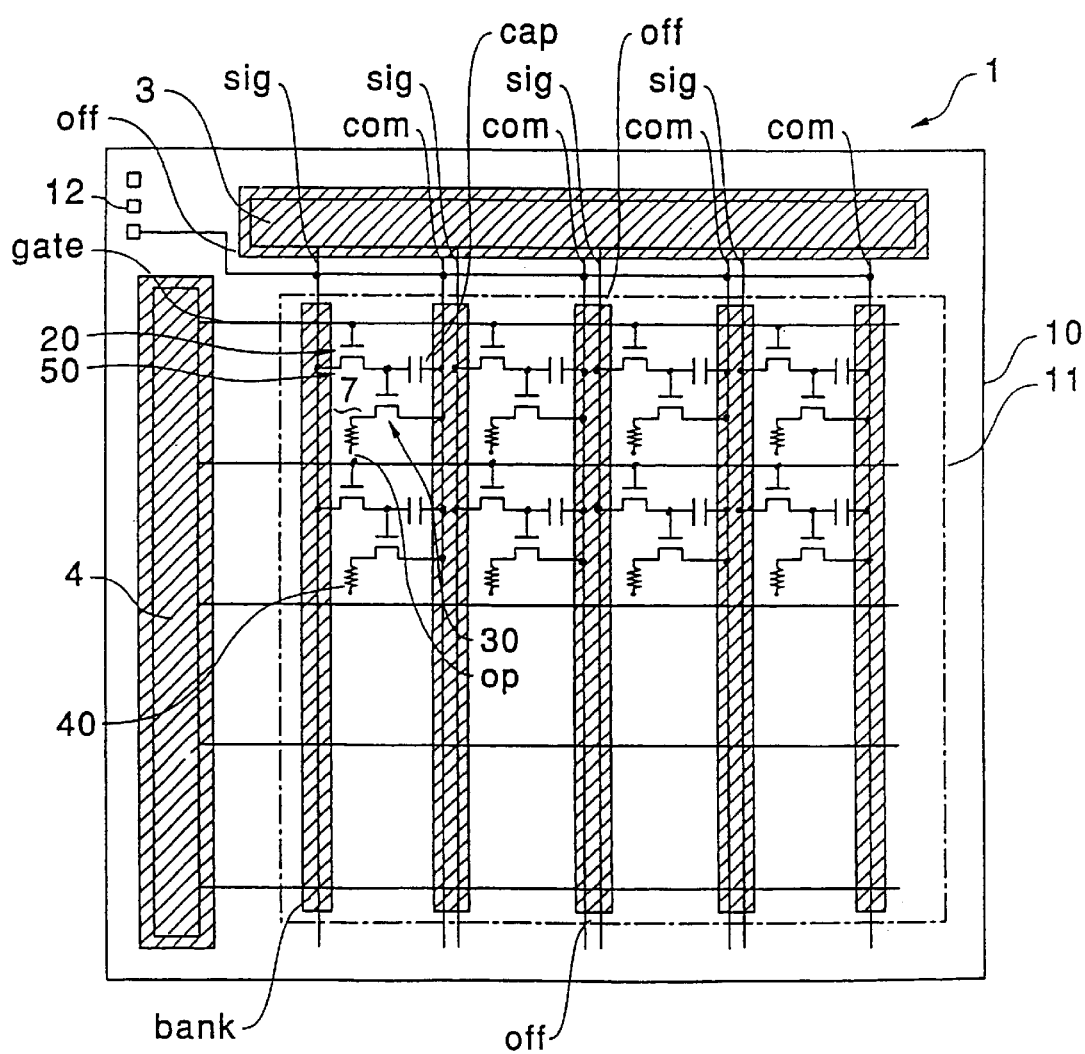
FIG. 10 is a block diagram which schematically shows the general layout of an active matrix display device as embodiment 2 of the present invention.
Figure 11:
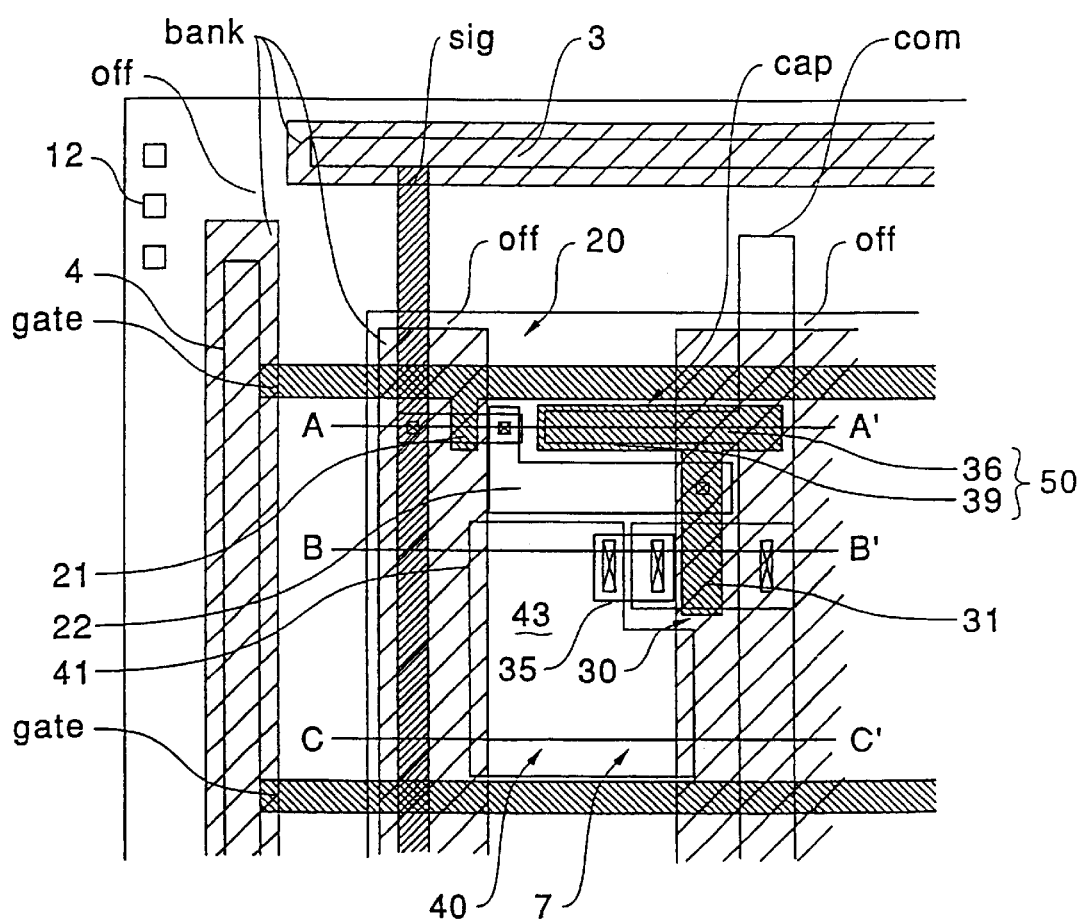
FIG. 11 is a plan view which shows a pixel included in the active matrix display device shown in FIG. 10.
Figure 12A:
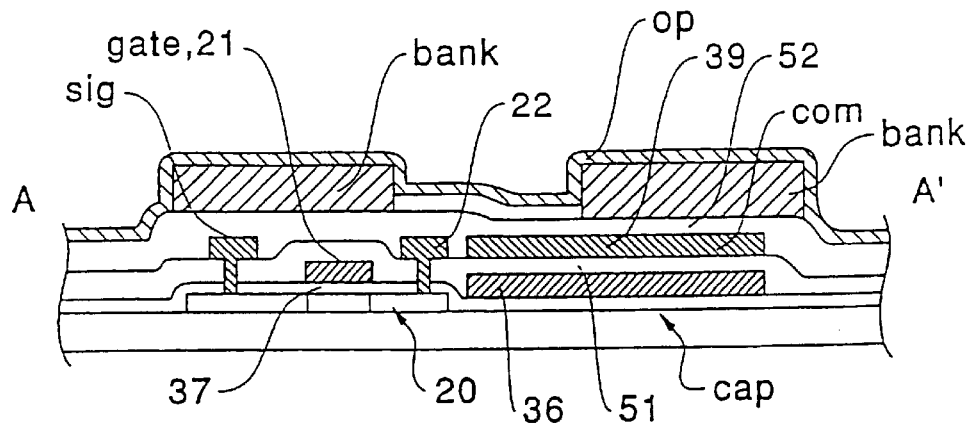
FIGS. 12(A), 12(B), and 12(C) are sectional views taken along the line A–A', the line B–B', and the line C–C' of FIG. 11, respectively.
Figure 12B:
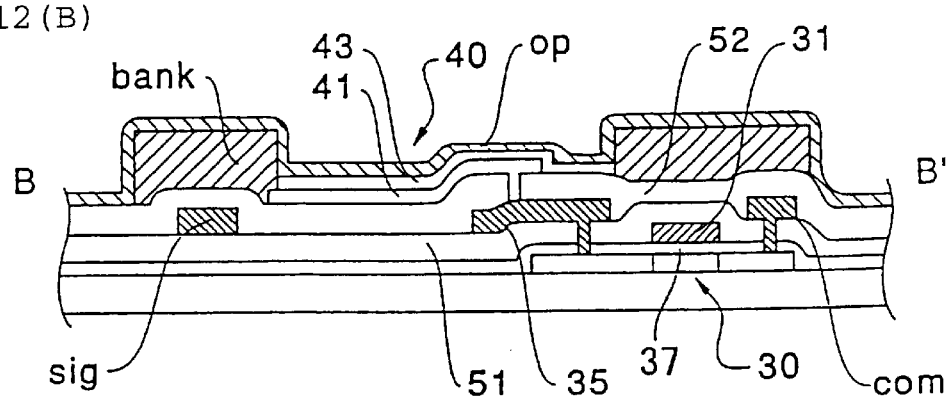
Figure 12C:
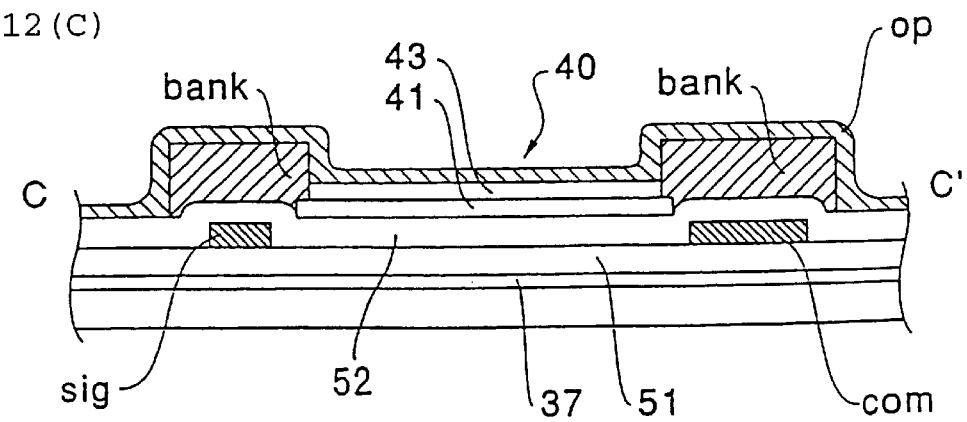

FIG. 10 is a block diagram which schematically shows the general layout of an active matrix display device. FIG. 11 is a plan view which shows a pixel included in the device shown in FIG. 10. FIGS. 12(A), 12(B), and 12(C) are sectional views taken along the line A–A', the line B–B', and the line C–C' of FIG. 11, respectively. Since this embodiment basically has the same configuration as that of embodiment 1, the same reference numerals are used for the parts that are the same as those of embodiment 1, and detailed description thereof will be omitted.

As shown in FIG. 10, FIG. 11, and FIGS. 12(A), 12(B), and 12(C), in an active matrix display device 1 of this embodiment, a thick insulating film composed of a resist film (bank layer bank, a shaded region in which lines that slant to the left are drawn at a large pitch) is formed in a strip along the data lines sig, and the opposing electrode op is formed on the upper layer side of the bank layer bank. Thereby, since the second interlayer insulating film 52 and the thick bank layer bank are interposed between the data line sig and the opposing electrode op, the capacitance that parasitizes the data line sig is significantly reduced. Therefore, the load on the drive circuits 3 and 4 can be decreased and lower consumption of electric power or faster display operation can be achieved.

The bank layer bank (diagonally shaded region) is also formed in the periphery of the transparent substrate 10 (a region external to the display area 11). Accordingly, both the data side drive circuit 3 and the scanning side drive circuit 4 are covered with the bank layer bank. Even if the opposing electrode op overlaps the region in which the drive circuits are formed, the bank layer bank is interposed between the wiring layer of the drive circuits and the opposing electrode op. Therefore, the parasitization of capacitance in the drive circuits 3 and 4 can be prevented, and thus the load on the drive circuit s 3 and 4 can be decreased and lower consumption of electric power or faster display operation can be achieved.

Moreover, in this embodiment, since the bank layer bank is formed along the data lines sig, the individual organic semiconductor films 43 corresponding to R, G, and B can be formed in a strip in the region bound in a strip by the bank layer bank using an ink jet process. Thereby, the full color active matrix display device 1 can be fabricated with high productivity.

Moreover, the bank layer bank is provided with a discontinuities portion off at each end of the data lines sig in the extending direction. There by, the opposing electrode op of each pixel 7 is connected to the opposing electrode op of the adjacent pixel 7 by extending over the bank layer bank. By tracing the extending direction of the data lines sig, it is found that the opposing electrodes op of the individual pixels 7 are connected to the adjacent row of pixels in the extending direction of the scanning lines gate, at the end of the data lines sig, through a discontinuities portion off (planar section which does not have a step due to the existence of the bank layer bank). Therefore, the opposing electrodes op of the individual pixels 7 are connected to each other through the planar section which does not have a step due to the existence of the bank layer bank, and the opposing electrode op of any pixel 7 is not disconnected.

Other Embodiments

Additionally, when the bank layer bank (insulating film) is composed of an organic material such as a resist film or a polyimide film, a thick film can be easily formed. When the bank layer bank (insulating film) is composed of an inorganic material such as a silicon oxide film or silicon nitride film deposited by a CVD process or SOG process, an alteration in the organic semiconductor film 43 can be prevented even if the insulating film is in contact with the organic semiconductor film 43.

Besides the structure in which the storage capacitor cap is formed by the common feeder com, the storage capacitor cap may be formed by a capacitance line formed in parallel to the scanning line gate.

Industrial Applicability

As described above, in an active matrix display device in accordance with the present invention, since a thick insulating film is interposed between data lines and opposing electrodes, the parasitization of capacitance in the data lines can be prevented. Therefore, the load on a data side drive circuit can be decreased, resulting in lower consumption of electric power or faster display operation. Additionally, a discontinuities portion is formed at a predetermined position of the thick insulating film and the section is planar. Accordingly, the opposing electrodes in the individual regions are electrically connected to each other through a section formed in the planar section, and even if disconnection occurs at a step due to the existence of the insulating film, electrical connection is secured through the planar section corresponding to the discontinuities portion of the insulating film. Thereby, even if a thick insulating film is formed around an organic semiconductor film to suppress parasitic capacitance or the like, disconnection does not occur in the opposing electrodes formed on the upper layer of the insulating film, and thus display quality and reliability of the active matrix display device can be improved.

What is claimed is:

1. An active matrix display device, comprising:

a substrate;

a display area on the substrate, the display area comprising a plurality of scanning lines extending in a first direction, a plurality of data lines extending in a second direction orthogonal to the first direction, and a plurality of pixels formed in a matrix by the data lines and the scanning lines, each of the pixels being provided with a thin film luminescent element comprising:

a thin film transistor including a gate electrode to which scanning signals are supplied from the plurality of scanning lines, a pixel electrode, an organic semiconductor film deposited above the pixel electrode, and an opposing electrode formed above the organic semiconductor film; and an insulating film that bounds a region where the organic semiconductor film is disposed, the insulating film comprising a discontinuities portion having a planar section without a formed step, through which the opposing electrode is connected to an opposing electrode of an adjacent thin luminescent element.

2. The active matrix display device according to claim 1, the thin film transistor being a first thin film transistor of a conduction control circuit, the conduction control circuit further comprising a second thin film transistor including a gate electrode connected to the data lines through the first thin film transistor, and the thin film luminescent element being driven by a driving current supplied from a common feeder formed independently of the data lines and the scanning lines that feeds a driving current.

3. The active matrix display device according to claim 1, the insulating film preventing spreading of a liquid material discharged by an ink jet when the liquid material as a precursor of the organic semiconductor film is applied by the ink jet process.

4. The active matrix display device according to claim 3, the insulating film having a thickness of 1 μm or more.

5. The active matrix display device according to claim 1, at least one portion of the insulating film being formed along the data lines and the scanning lines, the insulating film being provided with the discontinuities portion between pixels in both the first direction of extension of the scanning lines and second direction of extension of the data lines.

6. The active matrix display device according to claim 1, at least one portion of the insulating film being formed along the data lines and the scanning lines, the insulating film being provided with the discontinuities portion between pixels in the first direction of extension of the scanning lines.

7. The active matrix display device according to claim 1, at least one portion of the insulating film being formed along the data lines and the scanning lines, the insulating film being provided with the discontinuities portion between pixels in the second direction of extension of the data lines.

8. The active matrix display device according to claim 1, the insulating film being formed in a strip along the second direction of the data lines, the discontinuities portion being provided on at least one end in the second direction.

9. The active matrix display device according to claim 1, a region in which the thin film transistor is formed being covered with the insulating film.

10. The active matrix display device according to claim 1, further comprising a data-line driving circuit that supplies data signals through the data lines and a scanning-line driving circuit that supplies the scanning signals through the scanning lines in a periphery of the display area, the insulating film also being formed above the scanning-line driving circuit and the data-line driving circuit, and the insulating film comprising a discontinuities portion having a planar section without a formed step that connects opposing electrodes between a display area side and a substrate periphery side through the planar section at a position between a region in which the scanning-line driving circuit is formed and a region in which the data-line driving circuit is formed.

11. The active matrix display device according to claim 1, the discontinuities being formed by insulating film having a thickness that is smaller than a thickness of the insulating film that bounds the region where the organic semiconductor film is disposed.

12. The active matrix display device according to claim 1, the insulating film comprising an inorganic material.

* * * * *

UNITED STATES PATENT AND TRADEMARK OFFICE
CERTIFICATE OF CORRECTION

PATENT NO.    : 6,373,453 B1
DATED         : April 16, 2002
INVENTOR(S)   : Ichio Yudasaka It is certified that error appears in the above-identified patent and that said Letters Patent is hereby corrected as shown below:

<u>Title page,</u>
Item [54], replace the title as follows: -- ACTIVE MATRIX DISPLAY DEVICE --
Item [75], replace the city as follows: -- Chino --

Signed and Sealed this

Eighteenth Day of June, 2002

*Attest:*

*Attesting Officer*

JAMES E. ROGAN
*Director of the United States Patent and Trademark Office*